(12) United States Patent
Cheng et al.

(10) Patent No.: US 10,170,587 B2
(45) Date of Patent: *Jan. 1, 2019

(54) HETEROGENEOUS SOURCE DRAIN REGION AND EXTENSION REGION

(71) Applicant: INTERNATIONAL BUSINESS MACHINES CORPORATION, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/795,445

(22) Filed: Oct. 27, 2017

(65) Prior Publication Data

US 2018/0069124 A1 Mar. 8, 2018

Related U.S. Application Data

(63) Continuation of application No. 15/244,499, filed on Aug. 23, 2016, which is a continuation of application
(Continued)

(51) Int. Cl.
*H01L 21/336* (2006.01)
*H01L 29/66* (2006.01)
(Continued)

(52) U.S. Cl.
CPC .. *H01L 29/66583* (2013.01); *H01L 21/31051* (2013.01); *H01L 21/7684* (2013.01);
(Continued)

(58) Field of Classification Search
CPC ..................................... H01L 29/1041–29/105
See application file for complete search history.

(56) References Cited

U.S. PATENT DOCUMENTS

| 5,401,994 A | 3/1995 | Adan |
| 6,261,911 B1 | 7/2001 | Lee et al. |

(Continued)

OTHER PUBLICATIONS

List of IBM Patents or Patent Applications Treated as Related, dated herewith.

*Primary Examiner* — Kevin M Picardat
(74) *Attorney, Agent, or Firm* — ZIP Group PLLC

(57) ABSTRACT

A semiconductor structure includes a source drain region of a first material and an extension region of a second material. A semiconductor device fabrication process includes forming a sacrificial dielectric portion upon a semiconductor substrate, forming a sacrificial gate stack upon the sacrificial dielectric portion, forming a gate spacer upon the sacrificial dielectric portion against the sacrificial gate, forming a source drain region of a first doped material upon the semiconductor substrate against the gate spacer, forming a replacement gate trench by removing the sacrificial gate stack, forming an extension trench by removing the sacrificial dielectric portion, and forming an extension region of a second doped material within the extension trench.

12 Claims, 6 Drawing Sheets

Related U.S. Application Data

No. 14/330,158, filed on Jul. 14, 2014, now Pat. No. 9,472,628.

(51) Int. Cl.

| | |
|---|---|
| *H01L 21/8234* | (2006.01) |
| *H01L 29/417* | (2006.01) |
| *H01L 27/12* | (2006.01) |
| *H01L 29/161* | (2006.01) |
| *H01L 29/78* | (2006.01) |
| *H01L 21/768* | (2006.01) |
| *H01L 29/49* | (2006.01) |
| *H01L 29/267* | (2006.01) |
| *H01L 29/08* | (2006.01) |
| *H01L 21/3105* | (2006.01) |
| *H01L 29/10* | (2006.01) |
| *H01L 29/423* | (2006.01) |
| *H01L 21/28* | (2006.01) |
| *H01L 29/51* | (2006.01) |

(52) U.S. Cl.
CPC .. *H01L 21/76802* (2013.01); *H01L 21/76877* (2013.01); *H01L 21/823418* (2013.01); *H01L 21/823431* (2013.01); *H01L 21/823437* (2013.01); *H01L 21/823468* (2013.01); *H01L 21/823475* (2013.01); *H01L 27/1211* (2013.01); *H01L 29/0847* (2013.01); *H01L 29/161* (2013.01); *H01L 29/267* (2013.01); *H01L 29/41783* (2013.01); *H01L 29/41791* (2013.01); *H01L 29/4958* (2013.01); *H01L 29/6653* (2013.01); *H01L 29/6659* (2013.01); *H01L 29/66522* (2013.01); *H01L 29/66545* (2013.01); *H01L 29/66553* (2013.01); *H01L 29/66628* (2013.01); *H01L 29/66795* (2013.01); *H01L 29/7833* (2013.01); *H01L 29/7834* (2013.01); *H01L 29/7848* (2013.01); *H01L 29/7851* (2013.01); *H01L 21/2815* (2013.01); *H01L 29/1079* (2013.01); *H01L 29/42372* (2013.01); *H01L 29/4966* (2013.01); *H01L 29/517* (2013.01)

(56) References Cited

U.S. PATENT DOCUMENTS

| | | | |
|---|---|---|---|
| 6,303,453 B1 | 10/2001 | Schmitz et al. | |
| 6,331,468 B1 | 12/2001 | Aronowitz et al. | |
| 6,376,347 B1 | 4/2002 | Ohmura et al. | |
| 6,448,129 B1 | 9/2002 | Cho et al. | |
| 6,451,639 B1 | 9/2002 | Jang et al. | |
| 6,593,618 B2 * | 7/2003 | Kamata | H01L 21/823814 257/327 |
| 6,815,770 B1 | 11/2004 | Chien et al. | |
| 7,585,716 B2 | 9/2009 | Cheng | |
| 7,645,656 B2 | 1/2010 | Chen et al. | |
| 7,943,469 B2 | 5/2011 | Cook, Jr. et al. | |
| 8,492,234 B2 | 7/2013 | Chan et al. | |
| 8,524,592 B1 | 9/2013 | Xie et al. | |
| 8,673,699 B2 | 3/2014 | Adam et al. | |
| 9,112,032 B1 | 8/2015 | Liu et al. | |
| 9,318,388 B2 | 4/2016 | Xie et al. | |
| 9,362,181 B1 | 6/2016 | Xie et al. | |
| 9,472,628 B2 * | 10/2016 | Cheng | H01L 29/267 |
| 9,515,167 B2 | 12/2016 | Lu et al. | |
| 2002/0173128 A1 | 11/2002 | Muller et al. | |
| 2002/0190268 A1 | 12/2002 | Wang | |
| 2004/0072395 A1 | 4/2004 | Liu | |
| 2004/0169221 A1 | 9/2004 | Ko et al. | |
| 2004/0238809 A1 | 12/2004 | Adamec et al. | |
| 2006/0166417 A1 * | 7/2006 | Dokumaci | H01L 21/26506 438/161 |
| 2007/0045752 A1 | 3/2007 | Forbes | |
| 2007/0063253 A1 | 3/2007 | Choi | |
| 2008/0203432 A1 | 8/2008 | Kim | |
| 2009/0108352 A1 | 4/2009 | Majumdar et al. | |
| 2009/0124056 A1 | 5/2009 | Chen et al. | |
| 2010/0006945 A1 | 1/2010 | Merelle et al. | |
| 2010/0038705 A1 | 2/2010 | Doris et al. | |
| 2011/0074498 A1 | 3/2011 | Thompson et al. | |
| 2011/0281409 A1 | 11/2011 | Ellis-Monaghan | |
| 2012/0061759 A1 | 3/2012 | Cheng et al. | |
| 2012/0104470 A1 | 5/2012 | Ponoth et al. | |
| 2012/0187505 A1 | 7/2012 | Guo et al. | |
| 2013/0020613 A1 | 1/2013 | Mieno | |
| 2013/0082311 A1 | 4/2013 | Cheng et al. | |
| 2013/0175579 A1 | 7/2013 | Cheng et al. | |
| 2013/0241007 A1 | 9/2013 | Choi et al. | |
| 2013/0277752 A1 | 10/2013 | Glass et al. | |
| 2013/0285129 A1 | 10/2013 | Jensen et al. | |
| 2013/0285155 A1 | 10/2013 | Glass et al. | |
| 2013/0338956 A1 | 12/2013 | Zieren et al. | |
| 2014/0015014 A1 | 1/2014 | Cheng et al. | |
| 2014/0024181 A1 | 1/2014 | Adam et al. | |
| 2014/0124840 A1 | 5/2014 | Khakifirooz et al. | |
| 2014/0159124 A1 | 6/2014 | Doris et al. | |
| 2014/0159142 A1 | 6/2014 | Lim et al. | |
| 2014/0167163 A1 | 6/2014 | Cheng et al. | |
| 2014/0183599 A1 | 7/2014 | Hong et al. | |
| 2014/0252484 A1 | 9/2014 | Loechelt et al. | |
| 2014/0319625 A1 | 10/2014 | Zhao | |
| 2015/0084095 A1 | 3/2015 | Fenouillet-Beranger et al. | |
| 2015/0115374 A1 | 4/2015 | Yin et al. | |
| 2015/0162445 A1 | 6/2015 | Wu et al. | |
| 2015/0171216 A1 | 6/2015 | Xie et al. | |
| 2015/0249036 A1 | 9/2015 | Cai et al. | |
| 2015/0333172 A1 | 11/2015 | Cheng et al. | |
| 2016/0087098 A1 | 3/2016 | Liu et al. | |
| 2016/0172358 A1 | 6/2016 | Hatcher et al. | |
| 2016/0172495 A1 | 6/2016 | Zhu et al. | |
| 2016/0204261 A1 | 7/2016 | Jacob et al. | |
| 2016/0380074 A1 | 12/2016 | Cheng et al. | |
| 2017/0040449 A1 | 2/2017 | Asenov | |
| 2017/0117189 A1 | 4/2017 | Cheng et al. | |
| 2017/0117366 A1 | 4/2017 | Thompson et al. | |
| 2017/0236897 A1 | 8/2017 | Song et al. | |
| 2017/0323941 A1 | 11/2017 | Obradovic et al. | |
| 2018/0005894 A1 | 1/2018 | Zhang et al. | |
| 2018/0006030 A1 | 1/2018 | Cheng et al. | |
| 2018/0053853 A1 | 2/2018 | Cheng et al. | |

* cited by examiner

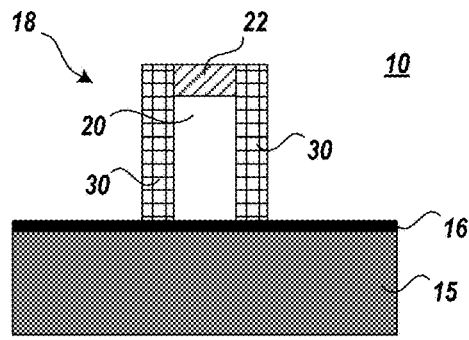
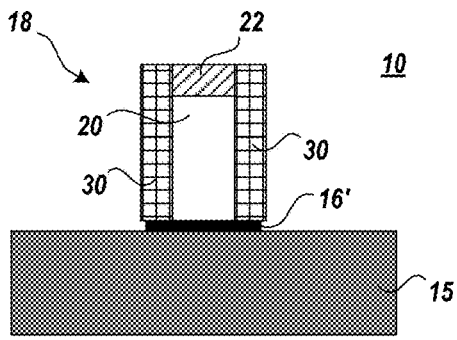
FIG. 4  FIG. 5
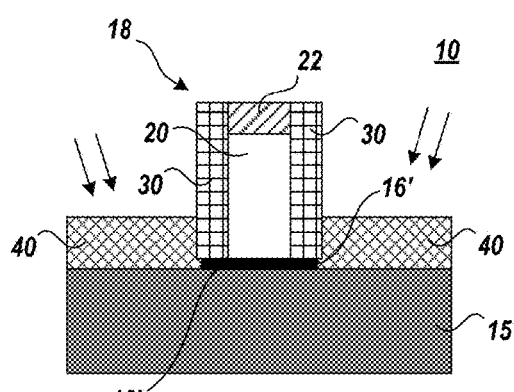
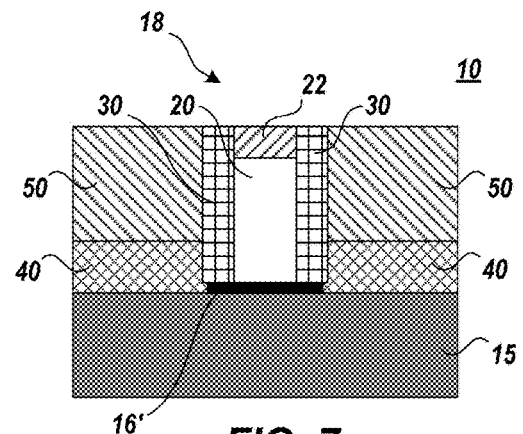
FIG. 6  FIG. 7
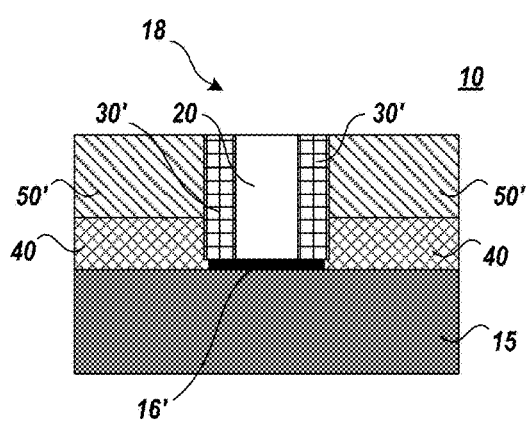
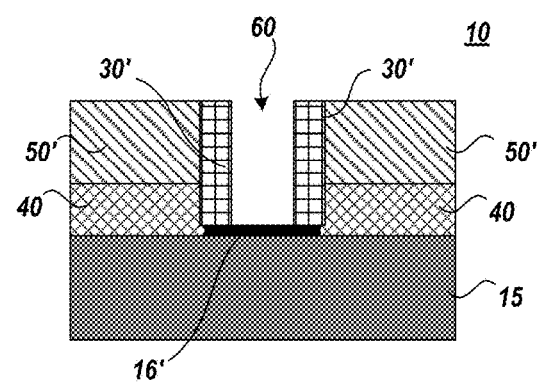
FIG. 8  FIG. 9

HETEROGENEOUS SOURCE DRAIN REGION AND EXTENSION REGION

FIELD

Embodiments of invention generally relate to semiconductor devices, design structures for designing a semiconductor device, and semiconductor device fabrication methods. More particularly, embodiments relate to semiconductor structures including a source drain (S/D) region of a first doped material and an extension region of a second doped material.

BACKGROUND

Extrinsic resistance and fringing capacitances reduce the performance of semiconductor structures including Fin-FETs. Methods fabrication and structures that reduce the parasitic resistance and capacitance are desired.

SUMMARY

Embodiments of invention generally relate to semiconductor devices, design structures for designing a semiconductor device, and semiconductor device fabrication methods. More particularly, embodiments relate to semiconductor structures including S/D regions consisting of a first material that fulfill contact resistance and doping requirements and extension regions consisting of a second material with increased mobility and dopants.

In a particular embodiment of the present invention, a semiconductor device fabrication process is presented. The process includes forming a gate trench within a source drain region of a first doped material that is formed upon a substrate. The process further includes forming an extension region of a second doped material that has a higher mobility relative to the first doped material upon the substrate within the gate trench.

In another embodiment of the present invention, a semiconductor device fabrication method is presented. The method includes forming a source drain region of a first doped material upon a substrate and forming an extension region upon the substrate against the source drain region. The extension region is formed of a second doped material that has a higher mobility relative to the first doped material.

In yet another embodiment of the present invention, a wafer fabrication method is presented. The method includes forming a source drain region of a first doped material upon a substrate and forming an extension region upon the substrate against the source drain region. The extension region is formed of a second doped material that has a higher mobility relative to the first doped material.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1-FIG. 18 depict cross section views of exemplary semiconductor structures at intermediate stages of semiconductor device fabrication, in accordance with various embodiments of the present invention.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to semiconductor structures utilizing a transistor gate. For example, a FinFET device may include a plurality of fins formed in a wafer and the gate formed orthogonal to the fins may cover a portion of the fins. The portion of the fins covered by the gate may serve as a channel region of the device. Portions of the fins may also extend out from under the gate and may serve as source and drain regions of the device. In addition to being a FinFET device, semiconductor structure 10 may also be a planar device, a nanowire device, etc. Semiconductor structure 10 is generally implemented with gate last fabrication process techniques. As opposed to gate last processes, in gate first processes, metal layers are formed and patterned to form gate structures followed by subsequent processing such as forming of the source and drain, forming spacers and depositing of an interlevel dielectric. In a gate last process, a dummy gate structure is formed followed by subsequent processing including formation of the source and drain, formation of spacers and deposition of the interlevel dielectric. Thereafter, the dummy gate structure is removed followed by deposition of a replacement gate structure.

Figure 1:
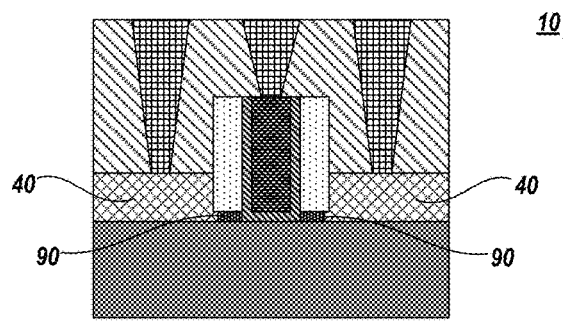

FIG. 1 depicts a cross section view of an exemplary semiconductor structure 10 at an intermediate stage of semiconductor device fabrication. In various embodiments, semiconductor structure 10 includes source drain (S/D) regions 40 and extension regions 90. Generally, S/D regions 40 consist of a first material that may be chosen to e.g. to satisfy contact resistance and doping requirements, etc. Extension regions 90 consist of a different material with relatively higher mobility and dopants, etc. In certain embodiments, extension regions 90 are formed by epitaxial formation, subsequent to removal of a sacrificial gate and sacrificial dielectric layer in a replacement gate fabrication process. In certain embodiments, utilizing the heterogeneous materials of S/D regions 40 and extension regions 90, structure 10 benefits from lower contact resistance (e.g. between 1E-9 ohm cm2 and 1E-8 ohm cm2, etc.), lower spreading resistance (e.g. between 500 ohm/square and 5000 ohm/square, etc.), lower extension resistance (e.g. between 500 ohm/square and 2000 ohm/square, etc.), well defined junction region positioning under the spacer, etc.

Referring now to the FIG. 2-FIG. 18 exemplary process steps of fabricating exemplary semiconductor structures 10, in accordance with various embodiments of the present invention, are shown and further described. It should be noted that the figures depict a cross section view of structure 10 oriented such that a view perpendicular to the length of a gate structure are depicted. Furthermore, it should be noted that while this description may refer to some components of the structure 10 in the singular tense, more than one component may implemented or depicted throughout the figures. The specific number of components depicted in the figures and the cross section orientation was chosen for illustrative purposes only.

Figure 2:
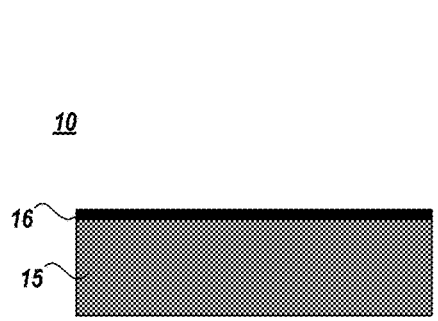

FIG. 2 depicts a cross section view of a semiconductor structure 10 at an intermediate stage of semiconductor device fabrication, in accordance with various embodiments of the present invention. At this stage of fabrication, a sacrificial dielectric layer 16 is formed upon a semiconductor substrate 15.

Substrate 15 may be, for example, a bulk semiconductor substrate or a layered substrate, such as a silicon-on-insulator (SOI), a SiGe-on-insulator (SGOI) or III-V on insulator. When substrate 15 is an SOI substrate, it may include a base substrate, a buried dielectric layer formed on top of the base substrate, and a SOI layer formed on top of the buried dielectric layer. The buried dielectric layer may isolate the SOI layer from the base substrate. The base substrate may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically, the base substrate may be about, but is not limited to, several hundred microns thick. For example, the base substrate may have a thickness ranging from 0.5 mm to about 1.5 mm.

The buried dielectric layer may include any of several dielectric materials, for example, oxides, nitrides and oxynitrides of silicon. The buried dielectric layer may also include oxides, nitrides and oxynitrides of elements other than silicon. In addition, the buried dielectric layer may include crystalline or non-crystalline dielectric material. Moreover, the buried dielectric layer may be formed using any of several known methods, for example, thermal or plasma oxidation or nitridation methods, chemical vapor deposition methods, and physical vapor deposition methods. The buried dielectric layer may have a thickness ranging from about 5 nm to about 250 nm. In one embodiment, the buried dielectric layer may have a thickness ranging from about 120 nm to about 200 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate and the SOI layer include semiconducting materials that include at least different crystallographic orientations. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that fins may be etched from the SOI layer when structure 10 is a FinFET device.

Sacrificial dielectric layer 16 is formed upon a top surface of substrate 15. Sacrificial dielectric layer 16 may be formed utilizing a conventional deposition process including, for example, chemical vapor deposition, plasma enhanced chemical vapor deposition or chemical solution deposition. Sacrificial dielectric layer 16 may be deposited to a thickness ranging from about 1 nm to about 20 nm. In one embodiment, sacrificial dielectric layer 16 may have a thickness ranging from about 3 nm to about 6 nm. Layer 16 is generally a dielectric material and in certain embodiments may be an oxide such as $SiO_2$, $GeO_2$, $Al_2O_3$, etc. In subsequent fabrication processes, one or more portions of sacrificial dielectric layer 16 are removed or otherwise sacrificed with a replacement material. In certain embodiments, sacrificial dielectric layer 16 can function as an etch stop layer during subsequent removal of sacrificial gate 20 material. Generally, sacrificial dielectric layer 16 may be formed by other known processes without deviating from the spirit of those embodiments herein claimed.

Figure 3:
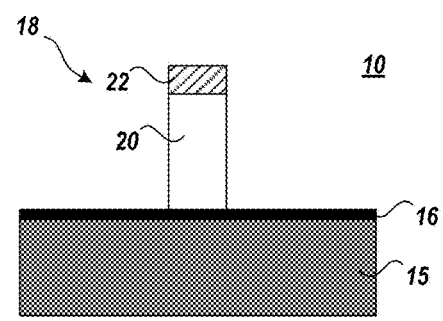

FIG. 3 depicts a cross section view of a semiconductor structure 10 at an intermediate stage of semiconductor device fabrication, in accordance with various embodiments of the present invention. At this stage of fabrication, a sacrificial gate stack 18 is formed upon sacrificial dielectric layer 16.

Sacrificial gate stack 18 may include, for example, a sacrificial gate 20 and a sacrificial gate cap 22. Generally, sacrificial gate stack 18 may be formed by using widely known techniques. For example, sacrificial gate stack 18 may be formed by depositing sacrificial gate 20 material upon an upper surface of sacrificial dielectric layer 16 and sacrificial gate cap 22 material may be deposited atop gate 20 and utilizing lithographic and etching processes to form the sacrificial gate stack 18 therefrom.

Sacrificial gate 20 material and sacrificial gate cap 22 may be any applicable material that may be later removed or otherwise sacrificed. For example, sacrificial gate 20 material may be polysilicon deposited by e.g. plasma-enhanced chemical vapor deposition (PECVD) and sacrificial gate cap 22 material may be e.g. silicon nitride, etc. The thickness of dummy gate 20 material may be from 10 nm to 500 nm, although lesser and greater thicknesses have been contemplated. In certain embodiments, gate cap 22 may serve as the etching mask (e.g. a hardmask, etc.) to form the gate stacks 18. The gate cap 22 may be deposited using low-pressure chemical vapor deposition (LPCVD) to a thickness of from about 15 nm to about 20 nm. The gate cap 22 may then be patterned in accordance with desired locations of the gate stacks 18 and an etchant may be used to remove portions of the dummy gate 20 material outside the gate stack 18 footprint, defining the gate stacks 18. Generally, sacrificial gate stack 18 may be formed by other known processes without deviating from the spirit of those embodiments herein claimed.

In various embodiments, the materials of sacrificial dielectric layer 16 and sacrificial gate 20 are chosen to provide for selective etching relative thereto. Such requirement may be satisfied by different combinations of material selections. For example, sacrificial dielectric layer 16 may be an oxide such as $SiO_2$, $GeO_2$, $Al_2O_3$ and sacrificial gate 20 may be polysilicon. Further, the dummy gate 20 material may be chosen such that it may be removed selectively with respect to gate spacers 30.

FIG. 4 depicts a cross section view of a semiconductor structure 10 at an intermediate stage of semiconductor device fabrication, in accordance with various embodiments of the present invention. At this stage of fabrication, gate spacers 30 are formed against the sidewalls of gate stack 18 upon sacrificial dielectric layer 16.

Gate spacers 30 may be a dielectric material, such as silicon oxide, silicon nitride, silicon oxynitride, a low-k material, or a combination. The gate spacer 30 may be formed by deposition of a spacer material and subsequent etching to remove the spacer material except from the sidewalls of the dummy gate stack 18. The width of the gate spacer 30 may be from 3 nm to 120 nm, and typically from 20 nm to 60 nm, although lesser and greater widths have been contemplated. The material of gate spacers 30 is chosen such that sacrificial gate 20 may be removed selectively with respect to gate spacers 30. For instance, if sacrificial gate 20 material is polysilicon, gate spacers 30 may be a silicon nitride, etc. The low-k material may be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. In certain embodiments, spacers 30 are sacrificial structures formed to act as a place holder for replacement spacers formed in subsequent fabrication steps. In other embodiments, spacers 30 are maintained. Generally, the gate spacers 30 may be formed by other known or additional techniques than those described without deviating from the spirit of those embodiments herein claimed.

FIG. 5 depicts a cross section view of a semiconductor structure 10 at an intermediate stage of semiconductor device fabrication, in accordance with various embodiments of the present invention. At this stage of fabrication, sacrificial dielectric layer 16 is selectively removed to expose the upper surface of substrate 15 generally outside the gate stack 18, gate spacers 30 footprint, etc. to form sacrificial dielectric layer portion 16'.

The sacrificial dielectric layer 16 may be removed using any suitable etching technique such as dry etch, wet etch, or combination of both. For example, sacrificial dielectric layer 16 can be removed using dry etch process followed by a wet cleaning process. In certain implementations, the etching technique may require a etch mask to be formed that resists etching to protect portions of semiconductor device 10. Following the formation of the etch mask, the sacrificial dielectric layer 16 may removed by an etch process having high selectivity to removing the material of sacrificial dielectric layer 16 without substantially removing the etch mask, gate stack 18, gate spacers 30, substrate 15, etc. Following the removal of sacrificial dielectric layer 16, the etch mask may be removed. Generally, a portion of sacrificial dielectric layer 16' is retained upon the removal of sacrificial dielectric layer 16 outside the gate stack 18, gate spacers 30 footprint, etc. In certain embodiments, (e.g. utilizing a dry etch, etc.) the sidewalls of sacrificial dielectric layer portion 16' may be coplanar with the sidewalls of gate spacers 30. In certain embodiments, (e.g. utilizing a wet etch, isotropic etch, etc.), as shown in FIG. 5, the sidewalls of sacrificial dielectric layer portion 16' may be relatively inside of the sidewalls of gate spacers 30. For instance, the wet enchant may undercut the sacrificial dielectric layer 16 to expose the substrate 15 generally within the footprint of gate spacers 30. Generally, sacrificial dielectric layer portion 16' may be formed by other known processes without deviating from the spirit of those embodiments herein claimed.

FIG. 6 depicts a cross section view of a semiconductor structure 10 at an intermediate stage of semiconductor device fabrication, in accordance with various embodiments of the present invention. At this stage of fabrication, S/D regions 40 are formed upon substrate 15 against spacers 30 and sacrificial dielectric layer portion 16'.

S/D regions 40 may be formed by depositing a S/D semiconductor layer upon substrate 15 against spacers 30 and sacrificial dielectric layer portion 16'. Therefore, in various embodiments, S/D region 40 material fills the undercut region generally below spacers 30. In certain embodiments, the S/D semiconductor layer may be of similar composition of the e.g. SOI layer of substrate 15. Generally, the S/D semiconductor layer and the SOI layer may include either identical or different semiconducting materials with respect to chemical composition, dopant concentration and crystallographic orientation. The S/D semiconductor layer may include a thickness ranging from about 5 nm to about 100 nm. In one embodiment, the SOI layer may have a thickness ranging from about 3 nm to about 100 nm.

S/D regions 40 may be further formed by a S/D implant to form a respective source (S) region and drain (D) regions adjacent to the sidewalls of the spacer 30. The S/D regions 40 may be doped with respective P/N dopants to a dopant concentration (e.g., about 1e20/cm3). In certain embodiments, the dopant concentration of the P/N dopants is chosen to reduce contact resistance. The S/D implant may be followed by low temperature rapid thermal anneal (RTA), e.g., a spike (several milliseconds) 1000° C. anneal, to drive in the implanted dopant, followed by a second laser anneal (e.g., 1300° C. for several milliseconds) to activate the implanted S/D dopant. The second laser anneal operation may serves to provide a sharp S/D junction by limiting diffusion of the dopant species.

Alternatively, S/D regions 40 may be formed by epitaxial deposition and doping processes. For example, the S/D regions 40 may be formed by epitaxy growth utilizing the substrate (e.g. SOI layer, etc.) as the epitaxial seed surface. Generally, epitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc. A non limiting list of exemplary epitaxial materials are: silicon germanium alloy (SiGe), Silicon (Si), in-situ boron doped SiGe or Si, in situ phosphorus or arsenic doped Si or SiGe, or doped III-V semiconductors with doping concentrations ranging from $1 \times 10^{19}$ cm$^{-3}$ to $1.5 \times 10^{21}$ cm$^{-3}$, with $4 \times 10^{20}$ cm$^{-3}$ to $9 \times 10^{20}$ cm$^{-3}$ dopant levels preferred. Such doping may be performed during the epitaxial growth, in so called in-situ doping schemes, as known in the art. Both p-type and n-type dopants are well known in the art, and any of them may be used in the embodiments of the present disclosure for doping the respective S/D regions 40. Generally, S/D regions 40 may be formed by other known processes without deviating from the spirit of those embodiments herein claimed.

FIG. 7 depicts a cross section view of a semiconductor structure 10 at an intermediate stage of semiconductor device fabrication, in accordance with various embodiments of the present invention. At this stage of fabrication, an interlayer dielectric (ILD) 50 is formed upon S/D regions against spacers. For example, ILD 50 may be a silicon oxide, etc. ILD 50 may be deposited to a thickness to cover gate stacks 18 (e.g. an upper surface of ILD 50 is above the upper surfaces of gates stacks 18, etc.). In such embodiments, a chemical/mechanical planarization (CMP) process may be utilized to remove the excess portions of ILD 50 such that the upper surface of ILD 50 is coplanar with the upper surfaces of gate stack 18. In various embodiments of the present invention, the material of ILD 50 is chosen to provide for subsequent selective etching of gate spacers 30. Generally, ILD 50 may be formed by other known processes without deviating from the spirit of those embodiments herein claimed.

FIG. 8 depicts a cross section view of a semiconductor structure 10 at an intermediate stage of semiconductor device fabrication, in accordance with various embodiments of the present invention. At this stage of fabrication, gate cap 22 is removed. For example, gate cap 22 may be removed by etching or removing portions of ILD 50 and gate spacers 30 utilizing the upper surface of sacrificial gate 20 as an etch stop. Alternatively, a CMP process may be utilized to e.g. remove portions of ILD 50, portions of gate spacers 30, gate cap 22, such that upper surfaces of ILD 50', gate spacers 30', and sacrificial gate 20 are coplanar. Upon the removal of gate cap 22, portions of ILD 50' and portions of gate spacers 30' are retained. Generally, gate cap 22 may be removed by other known processes without deviating from the spirit of those embodiments herein claimed.

FIG. 9 depicts a cross section view of a semiconductor structure 10 at an intermediate stage of semiconductor device fabrication, in accordance with various embodiments of the present invention. At this stage of fabrication, sacrificial gate 20 is removed creating replacement gate trench 60. Sacrificial gate 20 may be removed using any suitable etching technique such as dry etch, wet etch, or combination of both. For example, the etchant may be chosen to selectively etch or remove the material of sacrificial gate 20 and retain the gate spacers 30' utilizing the sacrificial dielectric layer portion 16' as an etch stop. In certain embodiments, upon the removal of sacrificial gate 20, the replacement gate trench 60 is formed. Generally, replacement gate trench 60 may be formed by other known processes without deviating from the spirit of those embodiments herein claimed.

Figure 10:
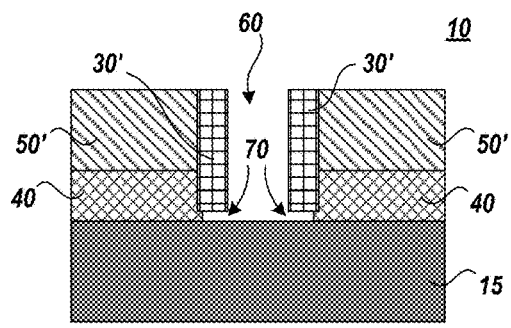

FIG. 10 depicts a cross section view of a semiconductor structure 10 at an intermediate stage of semiconductor device fabrication, in accordance with various embodiments of the present invention. At this stage of fabrication, sacrificial dielectric layer portion 16' is removed creating replacement extension trench 70. Sacrificial dielectric layer portion 16' may be removed using any suitable etching technique such as dry etch, wet etch, or combination of both. For example, sacrificial dielectric layer portion 16' may be removed by a wet etch process or a dry etch process utilizing an etchant with high selectively of removing the material of sacrificial dielectric layer portion 16' and retaining the material of gate spacers 30, substrate 15, etc. In various embodiments the removal of sacrificial dielectric layer portion 16' includes a vertical removal of sacrificial dielectric layer portion 16' generally accessible via replacement gate trench 60 and a horizontal removal of sacrificial dielectric layer portion 16' generally beneath gate spacers 30. In certain embodiments, upon the removal of sacrificial dielectric layer portion 16', the replacement extension trench 70 is formed. Generally, replacement extension trench 70 may be formed by other known processes without deviating from the spirit of those embodiments herein claimed.

Figure 11:
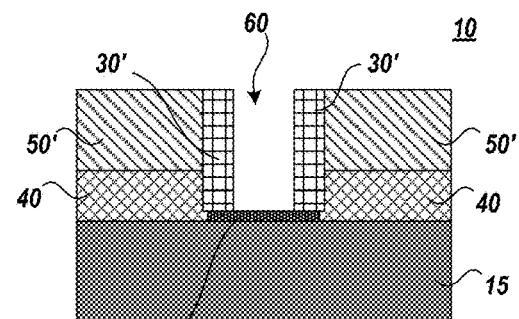

FIG. 11 depicts a cross section view of a semiconductor structure 10 at an intermediate stage of semiconductor device fabrication, in accordance with various embodiments of the present invention. At this stage of fabrication, extension layer 80 is formed within the extension trench 70. Extension layer 80 may be formed e.g. by epitaxial growth of a doped semiconductor material different from the material of S/D region 40 utilizing the semiconductor substrate as the epitaxial seed surface. For example, the extension layer 80 may be an III-V material with doping concentrations ranging from $1 \times 10^{18}$ cm$^{-3}$ to $1.5 \times 10^{21}$ cm$^{-3}$, with $4 \times 10^{20}$ cm$^{-3}$ to $9 \times 10^{20}$ cm$^{-3}$ dopant levels preferred. In certain embodiments, the extension layer 80 is formed upon the top surface of substrate 15 contacting and within the S/D regions within the extension trench 70. In certain embodiments, the top surface of extension layer 80 is coplanar with the bottom surface of gate spacers 30'. Generally, extension layer 80 may be formed by other known processes without deviating from the spirit of those embodiments herein claimed.

Figure 12:
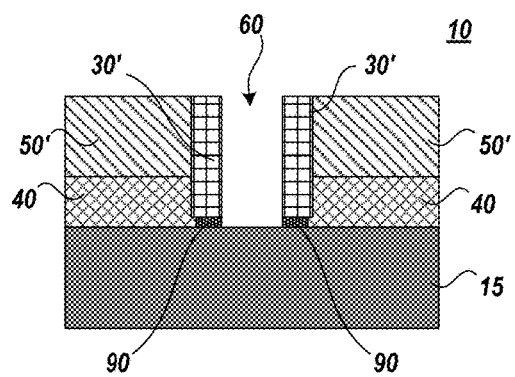

FIG. 12 depicts a cross section view of a semiconductor structure 10 at an intermediate stage of semiconductor device fabrication, in accordance with various embodiments of the present invention. At this stage of fabrication, extension regions 90 are formed by removing a portion of extension layer 80 exposed by replacement gate trench 60. Such channel portion of extension layer 80 may be removed using any suitable etching technique such as dry etch, wet etch, or combination of both. For example, the channel portion of extension layer 80 may be removed by a wet etch process utilizing an enchant that removes extension layer 80 and retain gate spacers 30' utilizing the top surface of substrate 15 as an etch stop.

Figure 13:
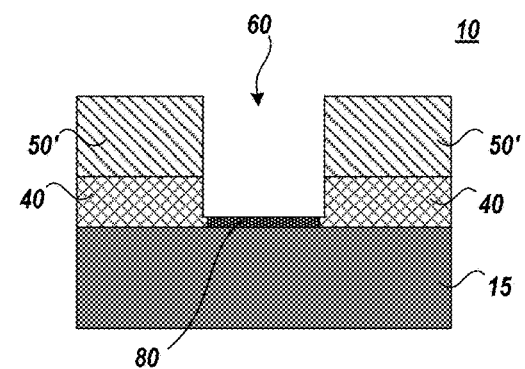
Figure 14:
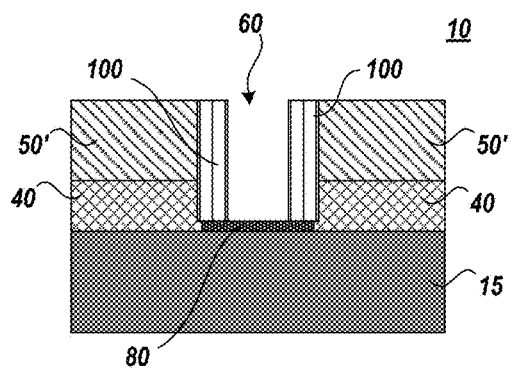
Figure 15:
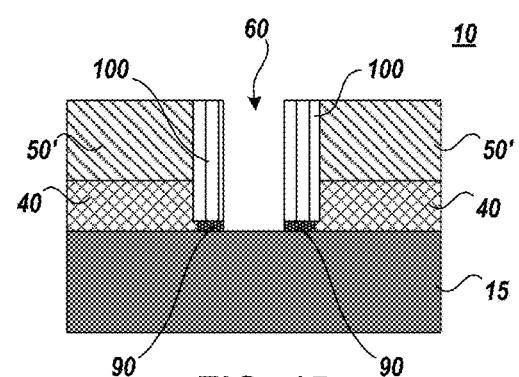

In those embodiments wherein gate spacers 30' are sacrificial, the spacers 30' may be removed subsequent to forming the extension layer 80, as shown in FIG. 13. Such sacrificial spacers 30' may be removed using any suitable etching technique such as dry etch, wet etch, or combination of both. For example, the sacrificial spacers 30' may be removed by a wet etch process utilizing an enchant that removes spacers 30' and retains ILD 50' and S/D regions 40 utilizing the top surface of extension layer 80 as an etch stop. As shown in FIG. 14, replacement spacers 100 may be formed in place of the removed spacers 30'. In various embodiments, replacement spacers 100 may be formed by deposition of a spacer material upon extension layer 80 and subsequent etching to remove spacer material except from the sidewalls of ILD 50 and S/D regions 40, thereby forming replacement gate trench 60. The width of the replacement spacers 100 may be from 3 nm to 120 nm, and typically from 20 nm to 60 nm, although lesser and greater widths have been contemplated. The material of gate replacement spacers 100 may be, for example, a low-k material. Generally, the replacement spacers 100 may be formed by other known or additional techniques than those described without deviating from the spirit of those embodiments herein claimed. As shown in FIG. 15, extension regions 90 may be formed by removing a portion of extension layer 80 exposed by replacement gate trench 60. Such channel portion of extension layer 80 may be removed using any suitable etching technique such as dry etch, wet etch, or combination of both. For example, the channel portion of extension layer 80 may be removed by a wet etch process utilizing an enchant that removes extension layer 80 and retain gate spacers 100 utilizing the top surface of substrate 15 as an etch stop.

Generally, subsequent to extension region 90 formation, an annealing process (e.g. temperature of about 1300° C. for a period of several milliseconds) may beneficially form a sharp, well defined extension region 90 junction beneath the spacer 30' or spacer 100 with minimal diffusion of the implanted dopant species. For clarity, spacer 120 is utilized herein to generically refer to either spacer 30', i.e. a non-sacrificial type gate spacer, or spacer 100, i.e. a replacement type spacer.

Figure 16:
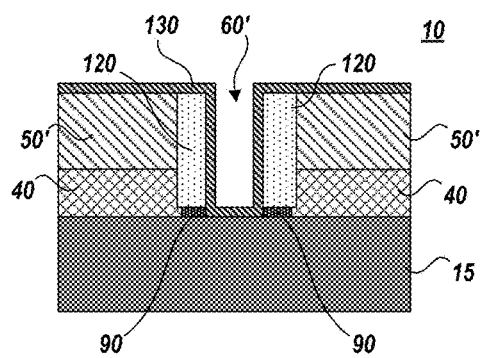

FIG. 16 depicts a cross section view of a semiconductor structure 10 at an intermediate stage of semiconductor device fabrication, in accordance with various embodiments of the present invention. At this stage of fabrication, high-k layer 130 is formed upon ILD 50' and within gate trench 60. The high-k layer 130 can be formed as a layer of high dielectric constant (high-k) material comprising a dielectric metal oxide and having a dielectric constant that is greater than the dielectric constant of silicon nitride of 7.5. The high-k layer 130 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k layer 130 may be from 1 nm to 10 nm, and more preferably from about 1.5 nm to about 3 nm. In various embodiments, the high-k layer 130 is formed upon the upper surfaces of ILD 50', upon the upper surfaces and sidewalls of spacers 120, sidewalls of extension regions 90, and upper surface of substrate 15 that is generally exposed by replacement gate trench 60. In various embodiments, the high-k layer 130 may not fill replacement gate trench 60. Thus, a remaining replacement gate trench 60' may be maintained. Generally, high-k layer 130 may be formed by other known processes without deviating from the spirit of those embodiments herein claimed.

Figure 17:
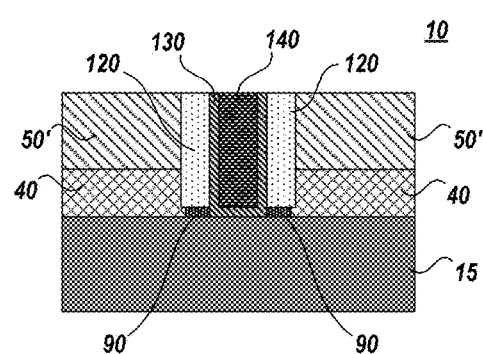

FIG. 17 depicts a cross section view of a semiconductor structure 10 at an intermediate stage of semiconductor device fabrication, in accordance with various embodiments of the present invention. At this stage of fabrication, replacement gate 140 is formed upon high-k layer 130 within replacement gate trench 60'. The replacement gate 140 material can be deposited directly on the top surface of the high-k dielectric layer 130 by, for example, chemical vapor deposition (CVD), physical vapor deposition (PVD), or atomic layer deposition (ALD). As non-limiting examples the replacement gate 140 material can include a metal system selected from one or more of TiN, TiC, TaN, TaC, TaSiN, HfN, W, Al and Ru, and is selected at least in part based on the desired work function (WF) of the device (e.g. NFET, PFET, etc.), as is known. In certain embodiments, a CMP process may be utilized. For example, the upper surface of ILD 50', the upper surfaces of gate spacers 120, the upper surface of high-k layer 130, and upper surface of replacement gate 140 may be coplanar. Generally, replacement gate 140 may be formed by other known processes without deviating from the spirit of those embodiments herein claimed.

Figure 18:
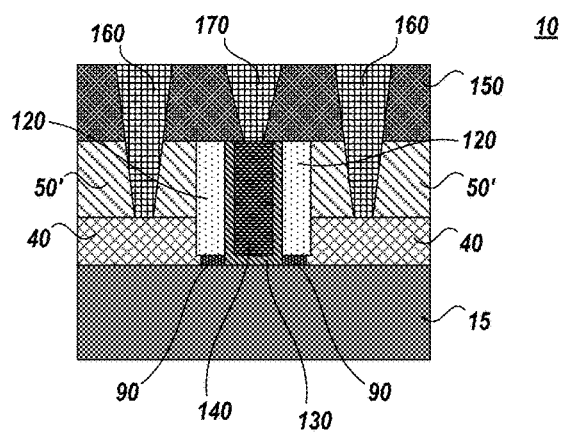

FIG. 18 depicts a cross section view of a semiconductor structure 10 at an intermediate stage of semiconductor device fabrication, in accordance with various embodiments of the present invention. At this stage of fabrication, planarization dielectric layer 150 is formed, contact trenches are formed, and contacts are formed within the contract trenches.

The planarization dielectric layer 150 is deposited upon the upper surface of ILD 50', the upper surfaces of gate spacers 120, the upper surface of high-k layer 130, and upper surface of replacement gate 140. Preferably, the planarization dielectric layer 150 includes a dielectric material that can be planarized, for example, by a CMP process. For example, the planarization dielectric layer 150 can include a doped silicate glass, an undoped silicate glass (silicon oxide), and/or porous or non-porous organosilicate glass. In various embodiments the material of planarization dielectric layer 150 may be similar to or differ from the material of ILD 50.

The planarization dielectric layer 150 is planarized above the topmost surfaces of the replacement gate 140 material. The planarization can be performed, for example, by CMP.

Contact trenches may be formed within the planarization dielectric layer 150 and/or ILD 50'. For example, S/D contact trenches may be formed within planarization dielectric layer 150 and ILD 50' to expose the top surface of S/D regions 40, respectively. Further, a channel contact trench may be formed within planarization dielectric layer 150 to expose the top surface of the e.g. replacement gate 140. Such contact trenches may be removed using any suitable etching technique such as dry etch, wet etch, or combination of both. For example, the portions of planarization dielectric layer 150 and/or ILD 50' may be removed by a one or dual stage wet etch process utilizing an enchant that removes planarization dielectric layer 150 and/or ILD 50' utilizing the top surface of S/D regions 40 and/or top surface of replacement gate 140 as etch stops. The contact trenches may be filled with a conductive material to form contacts. For example, a S/D contact 160 may be formed filling the contact trenches that expose the S/D regions 40 and a channel contact 170 may be formed by filling the contact trench that expose the replacement gate 140. In certain embodiments, a CMP process may be utilized to planarize the top surface of structure 10. For example, the upper surface of planarization dielectric layer 150, the upper surfaces of S/D contacts 160, and the upper surface of channel contact 170 may be coplanar.

In certain embodiments, a liner, such as titanium nitride may be deposited within contact trenches prior to contact 160, 170 formation. For example, the liner may be formed upon the sidewalls of contact trenches and contact trenches. In such embodiments, the remaining contact trenches and contact trenches may be filled with electrically conductive material forming contacts 160 and contacts 170. Contacts 160 and contacts 170 may be e.g. tungsten, copper, etc. Contacts 160, 170 are generally formed within respective contact trenches and electrically contact the liner therein. Contacts 160 and contacts 170 provide for an electrical connection to respective active regions e.g. source drain regions 40, channel region, etc. of semiconductor structure 10. Even further, contacts 160 and contacts 170 provide for an electrical connection with another component(s) formed above contacts 160 and contacts 170, respectively. In certain embodiments, after forming contacts 160 and contacts 170. For clarity, structure 10 as shown in FIG. 18, may undergo further fabrication steps that may add or remove layers, materials, etc. in further front end of line, middle end of line, or back end of line fabrication steps to form a semiconductor device.

Figure 19:
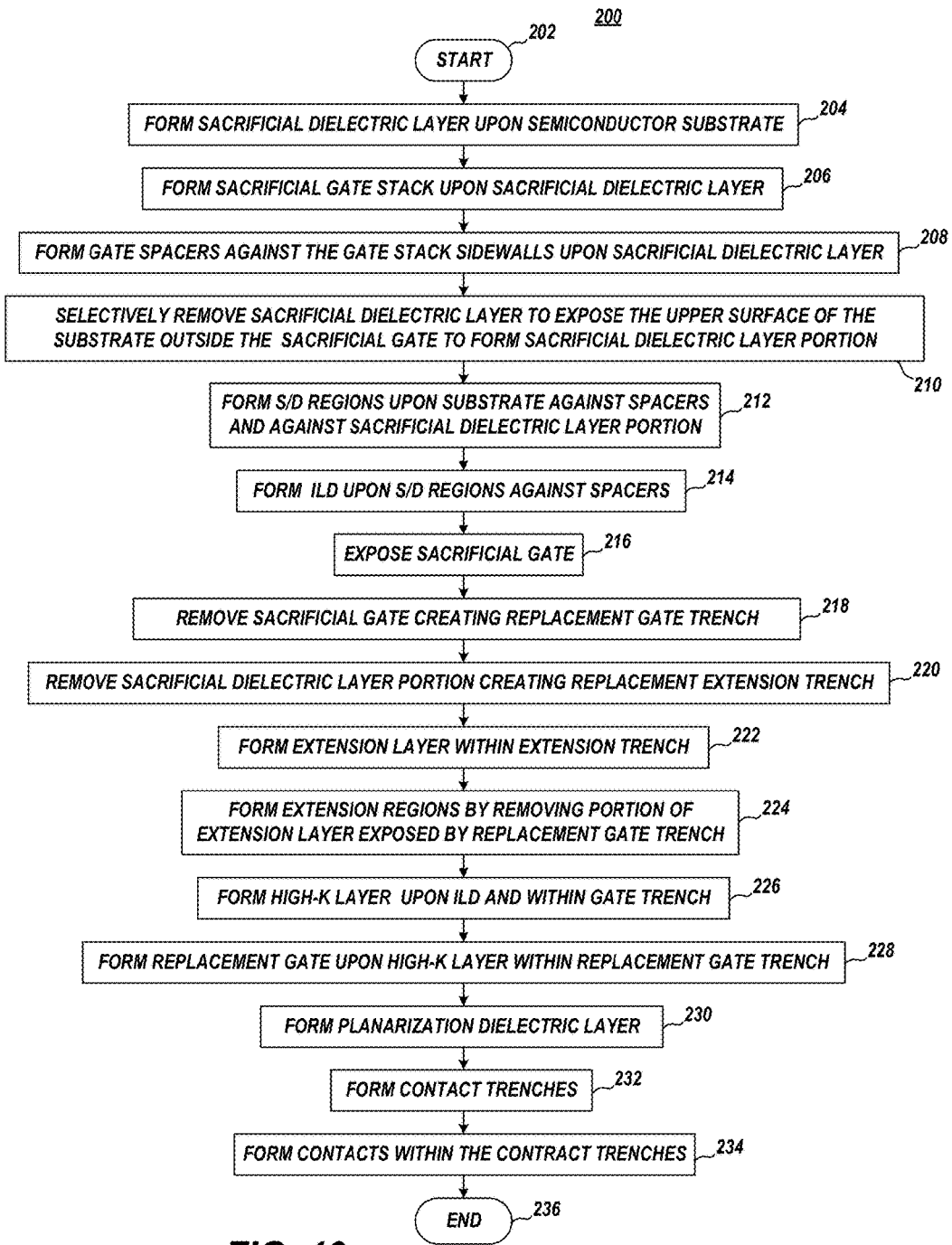
FIG. 19 and FIG. 20 depict exemplary fabrication process flow methods, in accordance with various embodiments of the present invention.

FIG. 19 depicts an exemplary process flow method 200 for manufacturing a semiconductor device, in accordance with various embodiments of the present invention. In various embodiments, method 200 may be utilized to fabricate semiconductor structure 10 that includes respective S/D regions 40 of the first material that may be chosen to e.g. to satisfy contact resistance and doping requirements, etc. and extension regions 90 of a different material with relatively higher mobility and dopants, etc.

Method 200 begins at block 202 and continues with forming or otherwise depositing a sacrificial dielectric layer (e.g. sacrificial dielectric layer 16, etc.) upon a semiconductor substrate (e.g. semiconductor substrate 15) (block 204). FIG. 2 depicts an exemplary semiconductor structure 10 subsequent to those fabrication processes of block 204.

Method 200 may continue with forming a sacrificial gate stack (e.g. sacrificial gate stack 18, etc.) upon the sacrificial dielectric layer (block 206). The sacrificial gate stack may include a sacrificial gate (e.g. sacrificial gate 20, etc.) and a sacrificial gate cap (e.g. sacrificial gate cap 22, etc.). FIG. 3 depicts an exemplary semiconductor structure 10 subsequent to those fabrication processes of block 206.

Method 200 may continue with forming gate spacers (e.g. non-sacrificial spacers, spacers 30, etc.) upon the sacrificial dielectric layer generally against the sidewalls of the sacrificial gate stack (block 208). FIG. 4 depicts an exemplary semiconductor structure 10 subsequent to those fabrication processes of block 208.

Method 200 may continue with forming sacrificial dielectric portion (e.g. sacrificial dielectric portion 16', etc.) by selectively removing the sacrificial dielectric layer and exposing the upper surface of the of the substrate generally outside of the sacrificial gate (block 210). FIG. 5 depicts an exemplary semiconductor structure 10 subsequent to those fabrication processes of block 210.

Method 200 may continue with forming source/drain regions (e.g. S/D regions 40, etc.) upon the substrate generally against the spacers and against the sacrificial dielectric portion (block 212). FIG. 6 depicts an exemplary semiconductor structure 10 subsequent to those fabrication processes of block 212. Method 200 may continue by forming an interlayer dielectric (ILD 50, etc.) upon the source drain regions generally against the spacers (block 214). FIG. 7 depicts an exemplary semiconductor structure 10 subsequent to those fabrication processes of block 214. Method 200 may continue by exposing the sacrificial gate by removing at least the sacrificial gate cap (block 216). Such techniques of block 216 may also remove portions of spacers, and/or portions of the interlayer dielectric. FIG. 8 depicts an exemplary semiconductor structure 10 subsequent to those fabrication processes of block 216.

Method 200 may continue with forming a replacement gate trench (e.g. replacement gate trench 60, etc.) by removing the sacrificial gate (block 218). FIG. 9 depicts an exemplary semiconductor structure 10 subsequent to those fabrication processes of block 218. Method 200 may continue with forming an extension trench (e.g. extension trench 70, etc.) by removing the sacrificial dielectric portion (block 220). For example, there may be a first generally vertical removal of the sacrificial dielectric portion via the replacement gate trench and a second generally horizontal removal of the sacrificial dielectric portions generally underneath the spacers. FIG. 10 depicts an exemplary semiconductor structure 10 subsequent to those fabrication processes of block 220.

Method 200 may continue with forming an extension layer (e.g. extension layer 80, etc.) within the extension trench (block 222). The extension layer may contact the inner surfaces of S/D regions 40 the upper surface of the substrate and the bottom surfaces of the spacers. FIG. 11 depicts an exemplary semiconductor structure 10 subsequent to those fabrication processes of block 222. Method 200 may continue with forming extension regions by removing the extension layer generally accessible by the replacement gate trench (block 224). FIG. 12 depicts an exemplary semiconductor structure 10 subsequent to those fabrication processes of block 224.

Method 200 may continue with forming a high-k layer (e.g. high-k layer 130) upon the interlayer dielectric and within the replacement gate trench (block 226). FIG. 16 depicts an exemplary semiconductor structure 10 subsequent to those fabrication processes of block 226. Method 200 may continue with forming a replacement gate (e.g. replacement gate 140, etc.) within the replacement gate trench (block 228). A subsequent planarization may be completed to remove excess portions of the high-k layer and excess portions of the replacement gate. FIG. 17 depicts an exemplary semiconductor structure 10 subsequent to those fabrication processes of block 228.

Method 200 may continue with forming a planarization dielectric layer upon the top surface of the interlayer dielectric, the top surface of the spacers, the top surface of the high-k layer, and the top surface of the replacement gate (block 230). Method 200 may continue with forming contact trenches within the planarization dielectric layer and/or the interlayer dielectric to expose the source drain regions and/or expose the replacement gate (block 232). Method 200 may continue with forming contacts by filling the contact trenches with electrically conductive material (block 234). FIG. 18 depicts an exemplary semiconductor structure 10 subsequent to those fabrication processes of blocks 230, 232, and 234. Method 200 ends at block 236.

Figure 20:
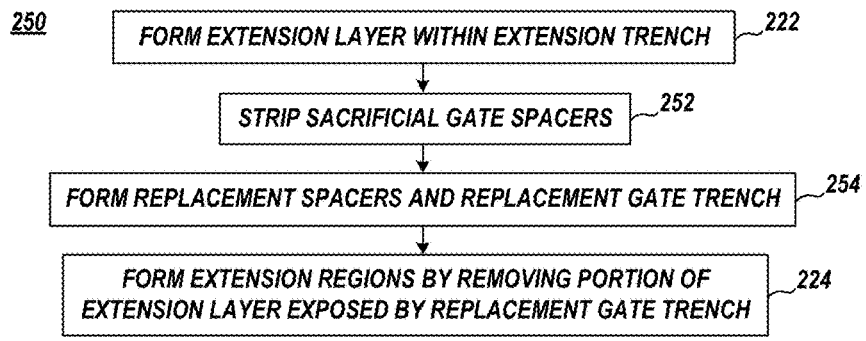

FIG. 20 depicts an exemplary process flow method 250 for manufacturing a semiconductor device, in accordance with various embodiments of the present invention. In various embodiments, method 250 may be utilized to fabricate semiconductor structure 10 that includes respective S/D regions 40 of the first material that may be chosen to e.g. to satisfy contact resistance and doping requirements, etc. and extension regions 90 of a different material with relatively higher mobility and dopants, etc. Generally, method 250 includes additional process that may be included of those embodiments of method 200 wherein the spacers of block 208 are sacrificial spacers.

Subsequent to block 222 and prior to block 224, method 250 includes stripping the sacrificial gate spacers (block 252). FIG. 13 depicts an exemplary semiconductor structure 10 subsequent to the fabrication processes of block 252. Method 250 may continue with forming replacement spacers (e.g. replacement spacers 100, etc.) and forming the replacement gate trench (block 254). FIG. 14 depicts an exemplary semiconductor structure 10 subsequent to those fabrication processes of block 254.

Figure 21:
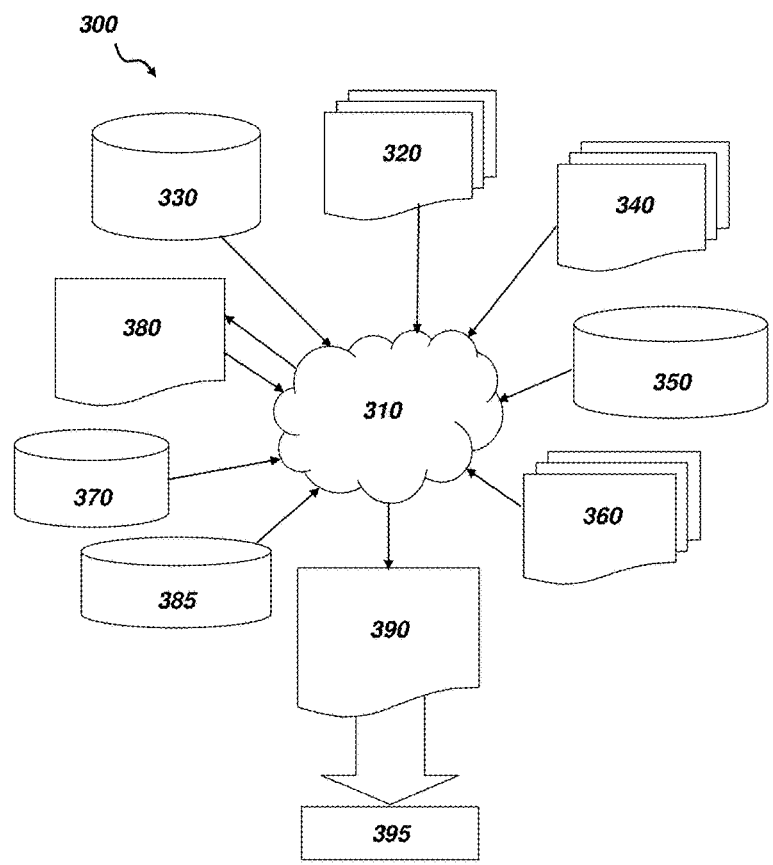
FIG. 21 depicts a flow diagram of a design process used in semiconductor design, manufacture, and/or test, in accordance with various embodiments of the present invention.

Referring now to FIG. 21, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-18.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-18. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-18 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-18. In one embodiment, design structure 390 may comprise a compiled, executable HDL simulation model that functionally simulates the devices shown in FIGS. 1-18.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-18. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless described otherwise or in addition to that described herein, "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication process comprising:
    forming a sacrificial portion upon a substrate;
    forming a sacrificial gate stack upon the sacrificial portion;
    forming a sacrificial gate spacer upon the sacrificial portion against the sacrificial gate;
    forming a source drain region of a first doped material upon the substrate against the gate spacer;
    removing the sacrificial gate stack forming a replacement gate trench;
    forming an extension trench between the sacrificial gate spacer and the substrate by removing the sacrificial portion accessible via the replacement gate trench;
    forming an extension region of a second doped material that has a higher mobility relative to the first doped material within the extension trench against the sacrificial gate spacer and against the substrate;
    removing the sacrificial gate spacer; and
    forming a replacement gate spacer upon the extension region.

2. The semiconductor device fabrication process of claim 1, further comprising:
    forming a gate liner upon the extension region, upon the replacement gate spacer, and upon the substrate.

3. The semiconductor device fabrication process of claim 2, further comprising:
    forming a replacement gate upon the gate liner.

4. The semiconductor device fabrication process of claim 1, wherein the substrate is a multilayered substrate.

5. The semiconductor device fabrication process of claim 1, wherein the substrate is a bulk substrate.

6. The semiconductor device fabrication process of claim 1, wherein the second doped material comprises a higher dopant concentration relative to the first doped material.

7. The semiconductor device fabrication process of claim 1, wherein the extension region electrically contacts the source drain region.

8. The semiconductor fabrication process of claim 3, further comprising:
    forming an interlayer dielectric portion upon the source drain region against the sacrificial gate spacer.

9. The semiconductor fabrication process of claim 8, further comprising:
    forming a planarization layer upon the interlayer dielectric portion, upon an upper surface of the replacement gate spacer, upon an upper surface of the gate liner, and upon the replacement gate.

10. The semiconductor fabrication process of claim 9, further comprising:
    forming a source drain contact trench within the planarization layer and within the interlayer dielectric portion to expose the source drain region; and
    forming a source drain contact by filling the source drain contact trench with electrically conductive material.

11. The semiconductor fabrication process of claim 1, wherein the sacrificial gate comprises sacrificial gate material formed upon the sacrificial portion and a sacrificial gate cap formed upon the sacrificial gate material.

12. The semiconductor fabrication process of claim 9, further comprising:

forming a channel contact trench within the planarization layer to expose the replacement gate; and forming a channel contact by filling the channel contact trench with electrically conductive material.

* * * * *